United States Patent
Song et al.

(10) Patent No.: US 11,016,598 B1
(45) Date of Patent: May 25, 2021

(54) ARTIFICIAL FINGER TIP SLIDING TOUCH SENSOR

(71) Applicant: SOUTHEAST UNIVERSITY, Nanjing (CN)

(72) Inventors: Aiguo Song, Nanjing (CN); Mingxin Leng, Nanjing (CN); Huijun Li, Nanjing (CN); Hong Zeng, Nanjing (CN); Baoguo Xu, Nanjing (CN); Lifeng Zhu, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 16/768,636

(22) PCT Filed: May 23, 2018

(86) PCT No.: PCT/CN2018/088078
§ 371 (c)(1),
(2) Date: May 29, 2020

(87) PCT Pub. No.: WO2019/104961
PCT Pub. Date: Jun. 6, 2019

(30) Foreign Application Priority Data

Nov. 30, 2017 (CN) .......................... 201711235136.0

(51) Int. Cl.
*G06F 3/041* (2006.01)
*G06F 3/044* (2006.01)
*G06F 3/0354* (2013.01)

(52) U.S. Cl.
CPC ...... *G06F 3/04144* (2019.05); *G06F 3/03547* (2013.01); *G06F 3/0446* (2019.05)

(58) Field of Classification Search
CPC . G06F 3/04144; G06F 3/0446; G06F 3/03547
See application file for complete search history.

(56) References Cited

U.S. PATENT DOCUMENTS 4,555,953 A * 12/1985 Dario ................... G01L 1/16
310/338
4,709,342 A * 11/1987 Hosoda ................. G01L 1/16
310/338
(Continued)

FOREIGN PATENT DOCUMENTS

CN 1582866 A 2/2005
CN 1982860 A 6/2007
(Continued)

OTHER PUBLICATIONS

Force/tactile sensor for robotic applications, G. De Maria, C. Natale, S. Pirozzi (Year: 2011).*

(Continued)

*Primary Examiner* — Amy Onyekaba
(74) *Attorney, Agent, or Firm* — Bayramoglu Law Offices LLC

(57) ABSTRACT

An artificial fingertip sliding tactile sensor includes a PVDF film, a rubber fingertip, a filling liquid, a sealing plug, a hydraulic sensor, a housing, an inner framework, and strain gauges. The rubber fingertip is a hemispherical cavity. The PVDF film is attached to the outside of the rubber fingertip. The sealing plug seals the rubber fingertip, and the hydraulic sensor is installed at the bottom of the sealing plug. The main body of the housing is a rigid cylindrical structure. The top of the housing is provided with a circular opening, and the bottom of the housing is a flange-like structure. Four circular through holes are uniformly distributed on the flange-like structure. The inner framework includes a cylindrical head, a vertical strain rod and a base. The strain gauges are respectively attached on four sides of the vertical strain rod and adjacent to the base.

10 Claims, 3 Drawing Sheets

(56) References Cited

U.S. PATENT DOCUMENTS

| | | | | |
|---|---|---|---|---|
| 4,982,611 | A * | 1/1991 | Lorenz | B25J 13/084 |
| | | | | 73/862.043 |
| 5,010,773 | A * | 4/1991 | Lorenz | B25J 13/084 |
| | | | | 310/319 |
| 5,261,266 | A * | 11/1993 | Lorenz | B25J 13/084 |
| | | | | 73/1.15 |
| 8,411,140 | B2 * | 4/2013 | Adelson | G01L 1/24 |
| | | | | 348/135 |
| 10,725,541 | B1 * | 7/2020 | Desalvo | G06F 3/016 |
| 2009/0133508 | A1 * | 5/2009 | Johansson | G01L 5/228 |
| | | | | 73/862.046 |
| 2009/0272201 | A1 * | 11/2009 | Loeb | G01L 5/228 |
| | | | | 73/862.041 |
| 2010/0127975 | A1 * | 5/2010 | Jensen | G06F 3/0488 |
| | | | | 345/157 |
| 2010/0139418 | A1 * | 6/2010 | Loeb | G01L 5/228 |
| | | | | 73/862.046 |
| 2016/0025615 | A1 * | 1/2016 | Fishel | G01N 19/00 |
| | | | | 702/33 |
| 2017/0060327 | A1 * | 3/2017 | Sakuma | G06F 3/044 |
| 2017/0066136 | A1 * | 3/2017 | Charalambides | G01L 5/228 |
| 2018/0077976 | A1 * | 3/2018 | Keller | A41D 1/005 |
| 2018/0098583 | A1 * | 4/2018 | Keller | A41D 19/0024 |
| 2019/0101981 | A1 * | 4/2019 | Elias | A63F 13/211 |
| 2020/0003635 | A1 * | 1/2020 | Hirano | H01L 24/16 |

FOREIGN PATENT DOCUMENTS

| | | | |
|---|---|---|---|
| CN | 101038223 A | | 9/2007 |
| CN | 101281067 A | * | 5/2008 |
| CN | 101281067 A | | 10/2008 |
| CN | 104236764 A | | 12/2014 |
| CN | 104990650 A | | 10/2015 |
| CN | 105136369 A | | 12/2015 |
| CN | 105738012 A | * | 4/2016 |
| CN | 205808596 U | | 12/2016 |
| CN | 107263470 A | | 10/2017 |
| JP | 2017133967 A | | 8/2017 |
| KR | 20140128537 A | | 11/2014 |

OTHER PUBLICATIONS

A Tactile Sensor System for a Three-Fingered Robot Manipulator, Jockusch, Walter . Ritter (Year: 1997).*

Yu Yuqing, et al., Fingertip haptic rendering system for touch screen image perception, Chinese Journal of Scientific Instrument, Jun. 2017, pp. 1524-1530, vol. 38, No. 6.

Zhongyi Qiu, et al., Design of a Flexible Bionic Haptic Sensor Based on Hydraulic Pressure, Apr. 2014, pp. 53-56.

* cited by examiner

ARTIFICIAL FINGER TIP SLIDING TOUCH SENSOR

CROSS REFERENCE TO THE RELATED APPLICATIONS

This application is the national phase entry of International Application No. PCT/CN2018/088078, filed on May 23, 2018, which is based upon and claims priority to Chinese Patent Application No. 201711235136.0, filed on Nov. 30, 2017, the entire contents of which are incorporated herein by reference.

TECHNICAL FIELD

The present invention relates to the technical field of sensors, and more particularly, to an artificial fingertip sliding tactile sensor.

BACKGROUND

Tactile sensing is an essential component of dexterous hand systems such as bionic prosthetic hands and manipulators for directly interacting with the external environment, and provides an important way to perceive environmental information. Robot tactile information can be divided into kinesthetic information from muscles and sliding sensory information. The sensing and control of manipulation can be performed orderly only when the two kinds of sensory information are combined. Among them, the kinesthetic information is mainly based on force sensory information, and reflects the position information of an end effector by detecting the force sensory information of the end effector; and the sliding sensory information includes information on shape, measurement, humidity, texture and others to achieve accurate recognition of objects. In order to accurately obtain the sliding sensory information and the kinesthetic information, it is imperative to develop an artificial fingertip sliding tactile sensor capable of accurately detecting the force applied on the top end of the sensor and the texture information of objects via a polyvinylidene fluoride (PVDF) film and a hydraulic sensor, and measuring the kinesthetic information on contact status via strain gauges, thus achieving the recognition, classification and manipulation of the objects, which improves the intelligent level and manipulation level of the dexterous hand system.

SUMMARY

In order to achieve accurate recognition and classification of objects, the present invention provides an artificial fingertip sliding tactile sensor capable of accurately detecting the force applied on the top end of the sensor and the texture information of objects via a PVDF film and a hydraulic sensor, and measuring the kinesthetic information on contact status via strain gauges, thus achieving the recognition, classification and manipulation of the objects, which improves the intelligent level and manipulation level of the dexterous hand system. In order to achieve the above-mentioned objective, the present invention provides an artificial fingertip sliding tactile sensor. The artificial fingertip sliding tactile sensor is installed at the end of a bionic prosthetic hand or a manipulator, and includes a PVDF film, a rubber fingertip, a filling liquid, a sealing plug, a hydraulic sensor, a housing, an inner framework, strain gauges, a detection circuit and connecting bolts. The rubber fingertip is a hemispherical cavity, and is filled with the filling liquid. The outer surface of the rubber fingertip is engraved with concentric circular textures. The PVDF film is attached to the outside of the rubber fingertip. A sealing plug is provided on one side of the rubber fingertip and configured to seal the rubber fingertip. The hydraulic sensor is installed at the bottom of the sealing plug. The main body of the housing is a rigid cylindrical structure. The periphery and the top of the housing are thin-walled. The top of the housing is provided with a circular opening. The bottom of the housing is a flange-like structure, and four circular smooth through holes are uniformly distributed on the flange-like structure. The rubber fingertip is arranged on the circular opening of the housing. The inner framework includes a cylindrical head, a vertical strain rod and a base. The cylindrical head is provided at the top end of the vertical strain rod, and the bottom of the vertical strain rod is connected to the base. The detection circuit is provided inside the base. The strain gauges are respectively attached on four sides of the vertical strain rod and adjacent to the base. Four circular threaded through holes are uniformly distributed on the base. The connecting bolts pass through the circular smooth through holes at the bottom of the housing and are screwed into the circular threaded through hole on the base to connect the inner framework to the housing.

Preferably, the PVDF film is a hemispherical flexible film. The hemispherical flexible film includes a piezoelectric film, a metalized electrode, a protective film and a lead wire. During a sliding movement, a micro-unit of the PVDF film is compressed by fine texture particles on the surface of the object to generate an induced charge, so that the surface texture characteristics of the object in contact with the PVDF film can be judged.

Preferably, the rubber fingertip is a hemispherical cavity, and concentric circular textured protrusions are arranged on the outer surface of the rubber fingertip. The bottom of the rubber fingertip is provided with a cylindrical recess. The cylindrical recess has a diameter larger than the diameter of the cylindrical head of the inner framework and is used for connection and fixing. One side of the rubber fingertip is provided with a circular liquid injection hole. The sealing plug covers the circular liquid injection hole for transmitting external pressure.

Preferably, the front end of the sealing plug is a rigid conduit, and the bottom of the sealing plug is provided with a bottom piston. The bottom piston is a flexible rubber disc. The bottom piston and the rigid conduit are connected by rubber. The hydraulic sensor is installed at the connection between the bottom of the rigid conduit and the bottom piston and configured to measure a change of the liquid pressure caused by the external pressure.

Preferably, the centers of the cylindrical head, the vertical strain rod and the base of the inner framework are linearly arranged in a straight line. The strain rod is an elongated rigid straight rod with a square cross section, and the base is a flat cylinder.

Preferably, the detection circuit is in the shape of a disc. The diameter of the detection circuit is less than the inner diameter of the housing. A square through hole is formed at the center of the detection circuit. The side length of the square through hole is greater than the side length of the cross section of the strain rod. Measurement circuits required by various sensing elements are arranged on the detection circuit.

Preferably, the filling liquid is a non-conductive and non-corrosive liquid that has strong fluidity and is less likely to be volatilized and solidified.

Preferably, the PVDF film and the rubber fingertip are closely attached by an adhesive. The cylindrical recess and the embedded cylindrical head are closely attached by the adhesive. The rubber fingertip and the housing are closely attached by the adhesive.

Preferably, one side of the housing is provided with a rectangular hole allowing the lead wire of the sensor to pass therethrough, wherein the rectangular hole is adjacent to the bottom of the housing.

Preferably, the strain gauges are fixed on the four sides of the strain rod by an adhesive, respectively, wherein the strain gauges are adjacent to the base and located at the same height. Two strain gauges on opposite sides form a half-bridge circuit for measuring the force applied on the end of the strain rod.

The present invention provides an artificial fingertip sliding tactile sensor. The PVDF film, the hydraulic sensor and the strain gauges are innovatively combined to extend the original use functions of the sensor, thus realizing the measurement of sliding sensory information and kinesthetic information. The sensor exhibits improved sensitivity by the design of bionic fingerprint texture structure, and thus can detect small texture changes, thereby improving the measurement sensitivity. The force applied on the sensor is converted into a change in liquid pressure. The liquid has certain compressibility and fluidity, which is similar to the deformation of the fingertip of the human body. The artificial fingertip sliding tactile sensor can accurately detect the force applied on the fingertip and can obtain force signals from different positions and different attitudes. The present invention has the advantages of simple structure and easy installation, debugging, and maintenance as well as good stability, good linearity, good repeatability, and high measurement accuracy.

Figure 1:
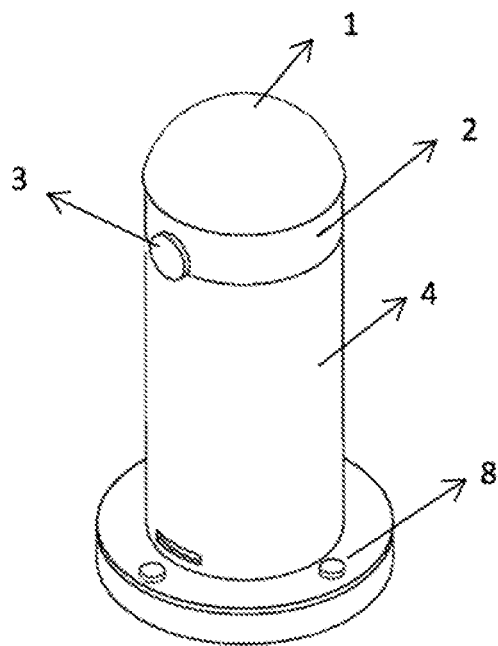
FIG. 1 is a schematic diagram of the overall structure of the sensor of the present invention.

In the figures: 1—PVDF film, 2—rubber fingertip, 21—liquid injection hole, 22—cylindrical recess, 3—sealing plug, 31—rigid conduit, 32—hydraulic sensor, 33—bottom piston, 4—housing, 41—circular opening, 42—circular smooth through hole, 43—housing square hole, 5—inner framework, 51—cylindrical head, 52—vertical strain rod, 53—base, 54—circular threaded through hole, 6—strain gauge, 7—detection circuit, 8—connecting bolt, 9—filling liquid.

DETAILED DESCRIPTION OF THE EMBODIMENTS

The present invention will be further described in detail hereinafter with reference to the drawings and the specific embodiments.

The present invention provides an artificial fingertip sliding tactile sensor capable of accurately detecting the force applied on the top end of the sensor and the texture information of objects via a PVDF film and a hydraulic sensor, and measuring the kinesthetic information on contact status via strain gauges, thus achieving the recognition, classification and manipulation of the objects, which improves the intelligent level and manipulation level of the dexterous hand system.

In a specific embodiment of the present invention, the present invention provides an artificial fingertip sliding tactile sensor. The artificial fingertip sliding tactile sensor is installed at the end of a bionic prosthetic hand or a manipulator and configured to obtain information on texture, material and shape of the object and information on contact status between the finger and the contact object, so as to realize accurate recognition, identification and manipulation of the object. The artificial fingertip sliding tactile sensor includes the PVDF film 1, the rubber fingertip 2, the filling liquid 9, the sealing plug 3, the hydraulic sensor 32, the housing 4, the inner framework 5, the strain gauges 6, the detection circuit 7 and the connecting bolts 8. The rubber fingertip 2 is a hemispherical cavity, is filled with the filling liquid. The outer surface of the rubber fingertip 2 is engraved with concentric circular textures. The PVDF film 1 is attached to the outside of the rubber fingertip and configured to perform texture detection on the object. The sealing plug 3 seals the rubber fingertip. The hydraulic sensor 32 is installed at the bottom of the sealing plug and configured to measure the force applied on the rubber fingertip. The main body of the housing 4 is a rigid cylindrical structure. The top of the housing 4 is provided with a circular opening. The bottom of the housing 4 is a flange-like structure. Four circular through holes are uniformly distributed on the flange-like structure and used for connection and fixing. The inner framework 5 includes a cylindrical head, a vertical strain rod and a base. The strain gauges are respectively attached on four sides of the vertical strain rod and adjacent to the base. Four circular threaded through holes are uniformly distributed on the base. The connecting bolts 8 pass through the through holes at the bottom of the housing and are screwed into the threaded through hole on the base to connect the inner framework to the housing.

The PVDF film 1 of the present invention is a hemispherical flexible film including a piezoelectric film, a metalized electrode, a protective film, a lead wire and others. During a sliding movement, a micro-unit of the PVDF film is compressed by fine texture particles on the surface of the object to generate an induced charge, so that the surface texture characteristics of the object in contact with the PVDF film can be judged.

The rubber fingertip 2 of the present invention is a hemispherical cavity. Concentric circular textured protrusions are arranged on the outer surface of the rubber fingertip 2. The cylindrical recess 22 at the bottom of the rubber fingertip 2 has a diameter slightly larger than the diameter of the cylindrical head 51 of the inner framework and is used for connection and fixing. The cavity is filled with the filling liquid 9 through the circular liquid injection hole 21 on one side of the rubber fingertip 2 for transmitting external pressure.

The front end of the sealing plug 3 of the present invention is the rigid conduit 31. The bottom piston 33 is a flexible rubber disc. The piston and the conduit are connected by rubber. The hydraulic sensor 32 is installed at the connection between the bottom of the conduit and the bottom disc and configured to measure the change of liquid pressure caused by external pressure.

The main body of the housing 4 of the present invention is a rigid cylindrical structure. The periphery and the top of the housing 4 are thin-walled. The top of the housing 4 is provided with the circular opening 41. The bottom of the housing 4 is a flange-like structure. The four circular smooth through holes 42 are uniformly distributed on the edge of the bottom of the housing 4 for connection and fixing.

The inner framework 5 of the present invention includes the cylindrical head 51, the vertical strain rod 52 and the base 53. The centers of the cylindrical head 51, the vertical strain rod 52 and the base 53 are linearly arranged in a straight line. The strain rod 52 is an elongated rigid straight rod with a square cross section. The strain gauges 6 are respectively attached on four sides of the strain rod 52 and adjacent to the base. The base 53 is a flat cylinder. The four circular threaded through holes 54 are uniformly distributed on the edge of the base 53 for connection and fixing.

The detection circuit 7 of the present invention is in the shape of a disc. The diameter of the detection circuit 7 is slightly less than the inner diameter of the housing 4. A square through hole is formed in the center of the detection circuit 7. The side length of the square through hole is slightly greater than the side length of the cross section of the strain rod 52. Measurement circuits required by various sensing elements are arranged on the detection circuit 7.

The head of the connecting bolt 8 of the present invention has a diameter larger than the diameter of both the threaded through hole 54 and the smooth through hole 42. The specification of the external thread on the shank is consistent with the specification of the internal thread in the threaded through hole 54. The inner framework 5 is fixedly connected to the housing 4 by the connecting bolts 8.

The filling liquid 9 of the present invention is a non-conductive and non-corrosive liquid that has strong fluidity and is less likely to be volatilized and solidified.

The PVDF film 1 of the present invention is closely attached to the rubber fingertip 2 by an adhesive. The circular textured protrusions on the surface of the rubber fingertip 2 can still be sensed through the PVDF film 1.

The diameter of the circular opening 41 at the top of the housing of the present invention is slightly larger than the diameter of the cylindrical head 51 of the inner framework, so that the inner framework does not directly contact the top of the housing.

The diameter of the cylindrical recess 22 at the bottom of the rubber fingertip of the present invention is slightly larger than the diameter of the cylindrical head 51 of the inner framework, but the cylindrical recess 22 and the cylindrical head 51 are of equal height, so that the cylindrical head 51 can be embedded in the cylindrical recess 22. The cylindrical recess 22 and the cylindrical head 51 are fixedly connected by an adhesive. Also, the bottom of the rubber fingertip 2 and the top of the housing 4 are fixedly connected by the adhesive.

The diameter of the main body of the housing 4 of the present invention is equal to the maximum diameter of the rubber fingertip 2. The centers of the housing 4 and the rubber fingertip 2 are linearly arranged in a straight line.

The flange-like structure at the bottom of the housing 4 of the present invention is equal to the diameter of the main body of the housing 4 and equal to the outer diameter of the base 53 of the inner framework. The four through holes on the base 53 also have the same position, but the diameter of the circular smooth through holes 42 is slightly larger than the diameter of the circular threaded through hole to facilitate the connection via the connecting bolts 8.

One side of the housing 4 is provided with the rectangular hole 43 allowing the lead wire of the sensor to pass therethrough, wherein the rectangular hole 43 is adjacent to the bottom of the housing 4.

The detection circuit 7 of the present invention is located inside the housing. The strain rod 52 passes through the square through hole in the center of the detection circuit 7. The electrical signal of the detection circuit 7 is connected to an external device through the hole 43 at the bottom of the housing 4 via the lead wire.

The strain gauges 6 of the present invention are fixed on four sides of the strain rod 52 by an adhesive, wherein the strain gauges 6 are adjacent to the base and located at the same height. Two strain gauges 6 on opposite sides form a half-bridge circuit for measuring the force applied on the end of the strain rod 52.

Figure 2:
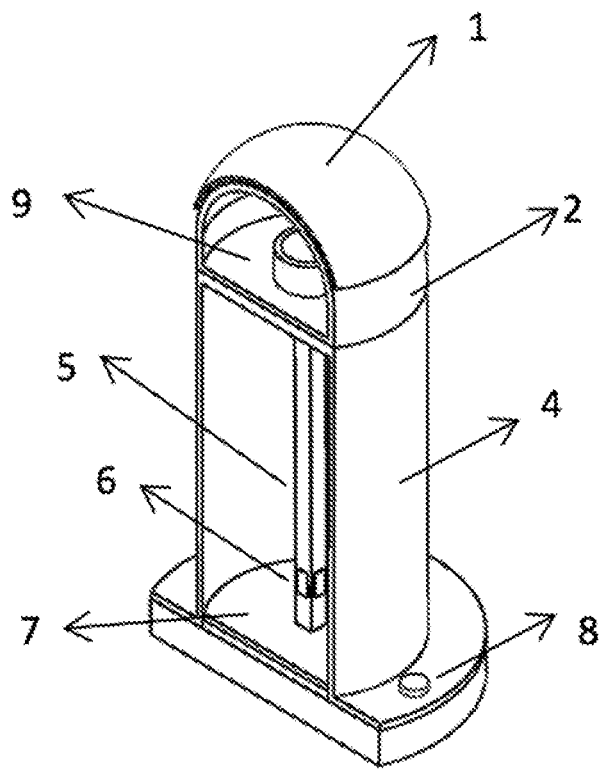
FIG. 2 is a cross-sectional view of the overall structure of the sensor of the present invention.

Referring to FIGS. 1 and 2, the artificial fingertip sliding tactile sensor provided in the present invention is installed at the end of a manipulator or a bionic prosthetic hand and configured to obtain information on texture, material and shape of the object and information on contact status between the finger and the contact object, so as to realize accurate recognition, identification and manipulation of the object. The artificial fingertip sliding tactile sensor includes the PVDF film 1, the rubber fingertip 2, the filling liquid 9, the sealing plug 3, the hydraulic sensor 32, the housing 4, the inner framework 5, the strain gauges 6, the detection circuit 7 and the connecting bolts 8.

Figure 3:
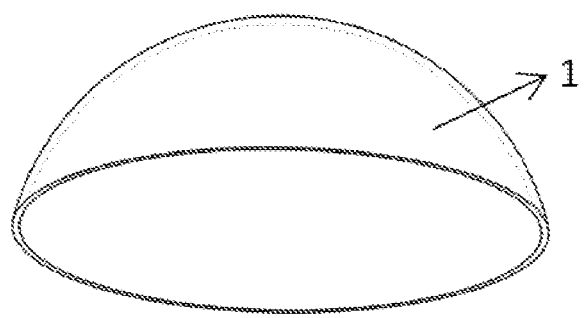
FIG. 3 is a schematic diagram of the PVDF film of the present invention.

Referring to FIG. 3, the PVDF film 1 is a hemispherical flexible film including a piezoelectric film, a metalized electrode, a protective film, a lead wire and others. The bottom edge of the PVDF film 1 has an outer diameter of 18 mm and a thickness of 1 mm. The electrical signal of the PVDF film 1 is connected to the detection circuit 7 via the rectangular hole 43 of the housing through the lead wire.

Figure 4:
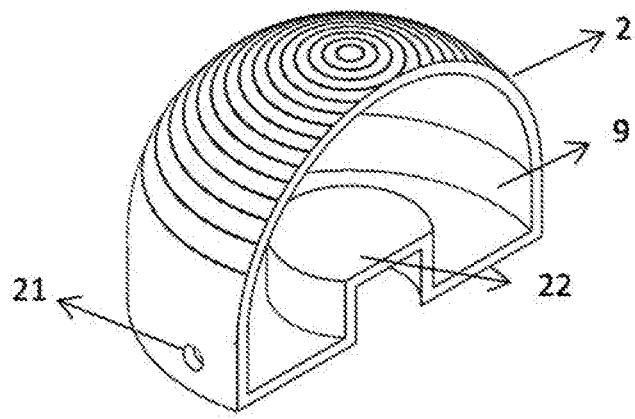
FIG. 4 is a cross-sectional view of the rubber fingertip of the present invention.

Referring to FIG. 4, the rubber fingertip 4 is a hemispherical cavity, and is made of rubber and has certain flexibility. The rubber fingertip has a maximum diameter of 16 mm and a wall thickness of 1 mm. Concentric circular textured protrusions are uniformly distributed on the outer surface of the rubber fingertip, wherein the height of the protrusion is 0.2 mm, and the difference in diameter between the concentric circular textured protrusions is 1 mm. The cylindrical recess 22 with a diameter of 5 mm and a height of 2.5 mm is arranged at the bottom in the center of the rubber fingertip and used for connection and fixing. The circular liquid injection hole 21 on one side of the rubber fingertip has a diameter of 5 mm. The cavity is filled with the filling liquid 9 for transmitting external pressure.

Figure 5:
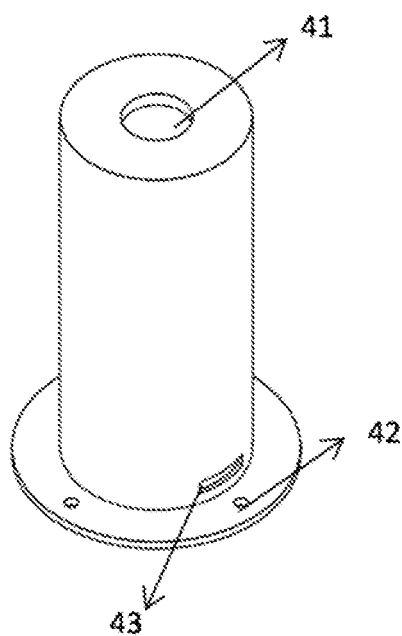
FIG. 5 is a schematic diagram of the housing of the present invention.

Referring to FIG. 5, the main body of the housing 4 is a metal cylindrical structure with a diameter of 16 mm and a height of 30 mm. The periphery and the top of the housing 4 has a thin wall with a thickness of 1 mm. The circular opening 41 with a diameter of 18 mm is formed at the center of the top of the housing 4. The bottom of the housing 4 is a flange-like structure with a diameter of 24 mm and a thickness of 2 mm. Four circular smooth through holes 42 are uniformly distributed on the edge of the bottom of the housing 4, and have a diameter of 3.3 mm. The distance between the center of the through hole and the center of the flange-like structure is 10 mm. The rectangular hole 43 with a size of 5 mm*10 mm is formed on one side of the housing 4 at the height of 5 mm from the flange-like structure and used for allowing the lead wire to pass therethrough.

Figure 6:
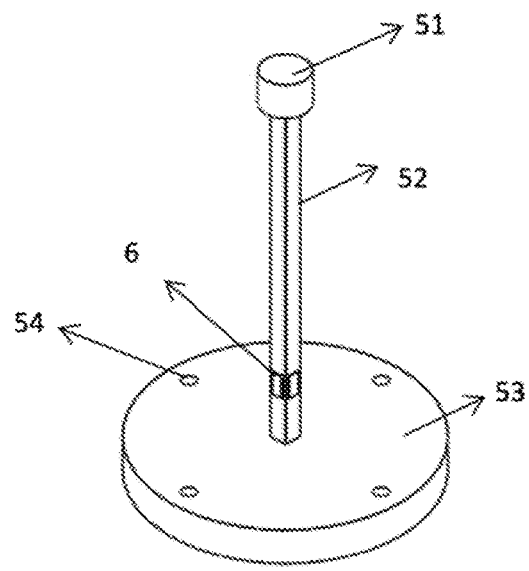
FIG. 6 is a schematic diagram of the inner framework of the present invention.

Referring to FIG. 6, the inner framework 5 includes the cylindrical head 51, the vertical strain rod 52, and the base 53. The centers of the cylindrical head 51, the vertical strain rod 52, and the base 53 are linearly arranged in a straight line. The cylindrical head 51, the vertical strain rod 52, and the base 53 are made of metal materials. The cylindrical head has a diameter of 4.8 mm and a height of 2.5 mm. The strain rod has a square cross section with a side length of 1.5 mm and has a height of 30 mm. The strain gauges 6 of the strain rod are attached on the four sides of the strain rod and adjacent to the base. The base is a flat cylinder with a diameter of 24 mm and a height of 3 mm. The four circular threaded through holes 54 provided with internal threads with a standard size of M3 are uniformly distributed on the edge of the base. The distance from the center of the circular threaded through hole to the center of the base is 10 mm.

Figure 7:
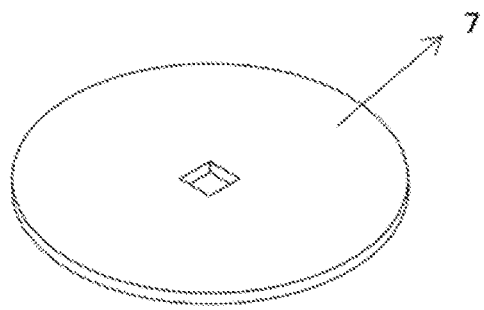
FIG. 7 is a schematic diagram of the detection circuit of the present invention.

Referring to FIG. 7, the detection circuit 7 is in the shape of a disc, is made of a printed circuit board (PCB), and has a diameter of 12 mm. A square through hole is formed in the center of the detection circuit 7 and has a side length of 2 mm. Measurement circuits required by various sensing elements are arranged on the detection circuit 7.

Referring to FIG. 2, the connecting bolt 8 has a head with a diameter of 6 mm and a shank provided with an external thread with a standard size of M3. The inner framework and the housing are fixedly connected by the connecting bolts.

Referring to FIG. 2, the filling liquid 9 is pure water, and is injected into the rubber fingertip by a needle syringe through the liquid injection hole 21. The PVDF film 1 is closely attached to the rubber fingertip 2 by an adhesive. The circular textured protrusions on the surface of the rubber fingertip can still be sensed through the PVDF film.

Referring to FIG. 2, the cylindrical head 51 can be embedded in the cylindrical recess 22. The cylindrical head 51 and the cylindrical recess 22 are fixedly connected by an adhesive. The bottom surface of the rubber fingertip 2 and the top surface of the housing 3 are also fixedly connected by the adhesive.

Referring to FIG. 6, the strain gauges 6 are fixed on the four sides of the vertical strain rod 52 by an adhesive, and are 5 mm away from the base. Two strain gauges on the opposite sides form a half-bridge circuit for measuring the force applied on the end of the strain rod.

Figure 8:
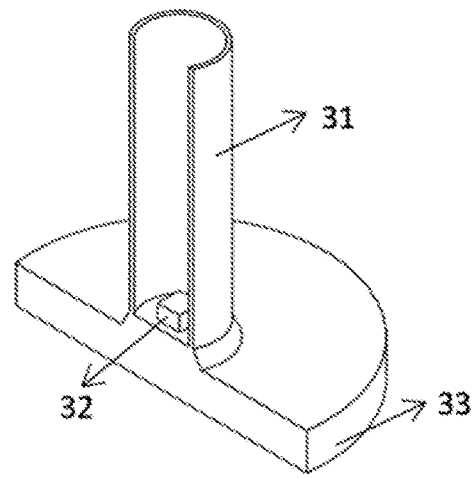
FIG. 8 is a cross-sectional view of the sealing plug of the present invention.

Referring to FIG. 8, the front end of the sealing plug 3 is a rigid conduit 31 with a length of 10 mm and an outer diameter of 5 mm. The bottom piston 33 is a flexible rubber disc with a diameter of 20 mm and a thickness of 3 mm. The piston and the conduit are connected through a rubber transition. The hydraulic sensor 32 is installed at the connection between the bottom of the conduit and the bottom disc, and configured to convert the change of liquid pressure into a change of voltage to measure the change of liquid pressure caused by external pressure. The piston and the liquid injection hole are closely connected to prevent liquid from leakage.

The above-mentioned description is only the preferred embodiments of the present invention, and not intended to limit the present invention in any other form. Any modifications or equivalent replacements made based on the technical essence of the present invention shall fall within the scope of protection claimed in the present invention.

What is claimed is:

1. An artificial fingertip sliding tactile sensor, comprising: a polyvinylidene fluoride (PVDF) film, a rubber fingertip, a filling liquid, a sealing plug, a hydraulic sensor, a housing, an inner framework, strain gauges, a detection circuit and connecting bolts;

wherein
the artificial fingertip sliding tactile sensor is installed at an end of a bionic prosthetic hand or a manipulator;
the rubber fingertip is a hemispherical cavity and filled with the filling liquid; an outer surface of the rubber fingertip is engraved with concentric circular textures; the PVDF film is attached to an outside of the rubber fingertip;
the sealing plug is provided on a side of the rubber fingertip and configured to seal the rubber fingertip; the hydraulic sensor is installed at a bottom of the sealing plug;
the housing is a rigid cylindrical structure; a periphery and a top of the housing are thin-walled; the top of the housing is provided with a circular opening, and a bottom of the housing is a flange-like structure; four circular smooth through holes are uniformly distributed on the flange-like structure; the rubber fingertip is provided on the circular opening of the housing;
the inner framework comprises a cylindrical head, a vertical strain rod and a base; the cylindrical head is provided at a top end of the vertical strain rod, and a bottom of the vertical strain rod is connected to the base;
the detection circuit is provided inside the base;
the strain gauges are respectively attached on four sides of the vertical strain rod and adjacent to the base; four circular threaded through holes are uniformly distributed on the base;
the connecting bolts pass through the four circular smooth through holes at the bottom of the housing and are screwed into the four circular threaded through holes of the base to connect the inner framework to the housing.

2. The artificial fingertip sliding tactile sensor according to claim 1, wherein, the PVDF film is a hemispherical flexible film, comprising a piezoelectric film, a metalized electrode, a protective film and a lead wire.

3. The artificial fingertip sliding tactile sensor according to claim 1, wherein, the rubber fingertip is a hemispherical cavity, and concentric circular textured protrusions are distributed on an outer surface of the rubber fingertip; a bottom of the rubber fingertip is provided with a cylindrical recess, and the cylindrical recess has a diameter larger than a diameter of the cylindrical head of the inner framework; a side of the rubber fingertip is provided with a circular liquid injection hole; and the sealing plug covers the circular liquid injection hole.

4. The artificial fingertip sliding tactile sensor according to claim 1, wherein, a front end of the sealing plug is a rigid conduit; the bottom of the sealing plug is provided with a bottom piston; the bottom piston is a flexible rubber disc; the bottom piston and the rigid conduit are connected by rubber; and the hydraulic sensor is installed at a connection between a bottom of the rigid conduit and the bottom piston.

5. The artificial fingertip sliding tactile sensor according to claim 1, wherein, the cylindrical head, the vertical strain rod and the base of the inner framework are concentrically and linearly arranged; the vertical strain rod is an elongated rigid straight rod with a square cross section; and the base is a flat cylinder.

6. The artificial fingertip sliding tactile sensor according to claim 1, wherein, the detection circuit is disc-shaped; a diameter of the detection circuit is less than an inner diameter of the housing; a square through hole is formed at a center of the detection circuit; a side length of the square through hole is greater than a side length of a cross section of the vertical strain rod; and measurement circuits required by a plurality of sensing elements are arranged on the detection circuit.

7. The artificial fingertip sliding tactile sensor according to claim 1, wherein, the filling liquid is a non-conductive and non-corrosive liquid.

8. The artificial fingertip sliding tactile sensor according to claim 3, wherein, the PVDF film and the rubber fingertip are attached by an adhesive; the cylindrical head and the cylindrical recess are attached by the adhesive, wherein the cylindrical head is embedded in the cylindrical recess; and the rubber fingertip and the housing are attached by the adhesive.

9. The artificial fingertip sliding tactile sensor according to claim 1, wherein, a side of the housing is provided with a rectangular hole adjacent to the bottom of the housing.

10. The artificial fingertip sliding tactile sensor according to claim 1, wherein, the strain gauges are fixed on the four sides of the vertical strain rod by an adhesive, wherein the strain gauges are adjacent to the base and located at an identical height; and two strain gauges of the strain gauges form a half-bridge circuit, wherein the two strain gauges are located on opposite sides of the four sides of the vertical strain rod.

\* \* \* \* \*